(12) United States Patent
Nishide et al.

(10) Patent No.: US 10,666,299 B2
(45) Date of Patent: May 26, 2020

(54) MAXIMUM LIKELIHOOD SEQUENCE ESTIMATION CIRCUIT, RECEIVING DEVICE, AND MAXIMUM LIKELIHOOD SEQUENCE ESTIMATION METHOD

(71) Applicant: MITSUBISHI ELECTRIC CORPORATION, Tokyo (JP)

(72) Inventors: Takehiko Nishide, Tokyo (JP); Masatsugu Higashinaka, Tokyo (JP); Koji Tomitsuka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/463,000

(22) PCT Filed: Dec. 9, 2016

(86) PCT No.: PCT/JP2016/086790
§ 371 (c)(1),
(2) Date: May 22, 2019

(87) PCT Pub. No.: WO2018/105118
PCT Pub. Date: Jun. 14, 2018

(65) Prior Publication Data
US 2019/0372606 A1    Dec. 5, 2019

(51) Int. Cl.
*H03M 13/39* (2006.01)
*H04B 7/08* (2006.01)
(Continued)

(52) U.S. Cl.
CPC .............. *H03M 13/39* (2013.01); *H04B 7/08* (2013.01); *H04L 7/041* (2013.01); *H04L 27/01* (2013.01)

(58) Field of Classification Search
CPC ........ H03M 13/39; H04L 27/01; H04L 7/041; H04L 2025/03585; H04L 25/0216; H04L 25/03292; H04L 25/03248
See application file for complete search history.

(56) References Cited

U.S. PATENT DOCUMENTS 5,444,721 A    8/1995    Okanoue et al.
5,844,946 A *  12/1998   Nagayasu ............. H03M 13/00
                                                 375/341
(Continued)

FOREIGN PATENT DOCUMENTS

JP    9-238099 A    9/1997
JP    2683665 B2   12/1997
(Continued)

OTHER PUBLICATIONS

Notification of Reasons for Refusal for application No. JP 2017-516181 dated Apr. 25, 2018.

*Primary Examiner* — Siu M Lee
(74) *Attorney, Agent, or Firm* — Birch, Stewart, Kolasch & Birch, LLP

(57) ABSTRACT

A maximum likelihood sequence estimation circuit includes: a signal extraction unit that estimates a reception sample signal including a preceding wave component and a reception sample signal including a delayed wave component from a plurality of reception sample signals sampled from a reception signal at sample intervals shorter than symbol intervals, and extracts, based on an estimation result, both first reception sample signals and second reception sample signals from the plurality of reception sample signals at the symbol intervals; and a maximum likelihood sequence estimation unit that estimates a maximum likelihood sequence using the first reception sample signals extracted and the second reception sample signals extracted.

10 Claims, 6 Drawing Sheets

(51) Int. Cl.
*H04L 7/04* (2006.01)
*H04L 27/01* (2006.01)

(56) References Cited

U.S. PATENT DOCUMENTS

| | | | | |
|---|---|---|---|---|
| 6,349,112 B1 * | 2/2002 | Shibata | ............... | H04L 25/0202 |
| | | | | 375/232 |
| 8,798,122 B2 * | 8/2014 | Herbig | ................. | H04B 7/0851 |
| | | | | 348/465 |
| 9,037,187 B2 * | 5/2015 | Valadon | ............ | H04L 25/03292 |
| | | | | 375/341 |
| 9,363,110 B2 * | 6/2016 | Zhang | ................. | H04L 25/0212 |
| 2002/0154690 A1 | 10/2002 | Okazaki | | |

FOREIGN PATENT DOCUMENTS

| | | |
|---|---|---|
| JP | 2002-101026 A | 4/2002 |
| JP | 2011-49937 A | 3/2011 |

\* cited by examiner

MAXIMUM LIKELIHOOD SEQUENCE ESTIMATION CIRCUIT, RECEIVING DEVICE, AND MAXIMUM LIKELIHOOD SEQUENCE ESTIMATION METHOD

FIELD

The present invention relates to a maximum likelihood sequence estimation circuit that performs maximum likelihood sequence estimation for correcting waveform distortion of a reception signal in a digital wireless communication system, a receiving device including a maximum likelihood sequence estimation circuit, and a maximum likelihood sequence estimation method.

BACKGROUND

In a digital wireless communication system, due to the multipath propagation environment, delayed waves cause mutual interference between symbols to produce distortion in the waveform of the signal, which can deteriorate the communication quality. Maximum likelihood sequence estimation is known as a technique for correcting such waveform distortion and improving the communication quality. Maximum likelihood sequence estimation is a technique of estimating a correct transmission symbol sequence by comparing a plurality of replica reception signals generated from transmission path impulse responses and a plurality of candidates for the transmission symbol sequence and reception sample signals sampled at symbol intervals from the actual reception signal. The comparison between a replica reception signal and a reception sample signal is performed using the square value of the difference between the replica reception signal and the reception sample signal, and this value is called a branch metric.

Patent Literature 1 discloses a technique for realizing good communication quality even in a propagation environment in which the delay time of a delayed wave is not an integral multiple of the symbol interval. Specifically, the technique of Patent Literature 1 includes performing maximum likelihood sequence estimation by using reception sample signals sampled from a reception signal at sample intervals shorter than the symbol intervals. In this technique, reception sample signals are sampled from a reception signal at sample intervals of 1/N of the symbol intervals and divided into N strings of reception sample signals, each including reception sample signals at symbol intervals. Then, maximum likelihood sequence estimation is performed using the branch metrics generated for each string.

CITATION LIST

Patent Literature

Patent Literature 1: Japanese Patent No. 2683665

SUMMARY

Technical Problem

However, according to the above conventional technique, maximum likelihood sequence estimation processing is performed using all the N strings of reception sample signals. Therefore, maximum likelihood sequence estimation processing is performed using reception sample signals that do not include effective delayed wave components. Such reception sample signals cause an increase in noise, resulting in failure to sufficiently improve the communication quality. In addition, N separate circuits are required for the process of estimating transmission path impulse responses and the process of calculating branch metrics, which are necessary for maximum likelihood sequence estimation, resulting in an increase in circuit scale.

The present invention has been made in view of the above, and an object thereof is to obtain a maximum likelihood sequence estimation circuit capable of improving the communication quality while preventing an increase in circuit scale even in a propagation environment in which the delay time of a delayed wave is not an integral multiple of the symbol interval.

Solution to Problem

In order to solve the above problems and achieve the object, a maximum likelihood sequence estimation circuit according to the present invention includes: a signal extraction unit that extracts, at symbol intervals, both first reception sample signals and second reception sample signals from a plurality of reception sample signals sampled from a reception signal at sample intervals shorter than symbol intervals; and a maximum likelihood sequence estimation unit that estimates a maximum likelihood sequence using the first reception sample signals extracted and the second reception sample signals extracted. The signal extraction unit estimates a reception sample signal including a preceding wave component and a reception sample signal including a delayed wave component, and extracts the first reception sample signals and the second reception sample signals based on the estimation result.

Advantageous Effects of Invention

The maximum likelihood sequence estimation circuit according to the present invention can achieve the effect of improving the communication quality while preventing an increase in circuit scale even in a propagation environment in which the delay time of a delayed wave is not an integral multiple of the symbol interval.

DESCRIPTION OF EMBODIMENTS

Hereinafter, a maximum likelihood sequence estimation circuit, a receiving device, and a maximum likelihood sequence estimation method according to embodiments of the present invention will be described in detail based on the drawings. The present invention is not limited to the embodiments.

First Embodiment

Figure 1:
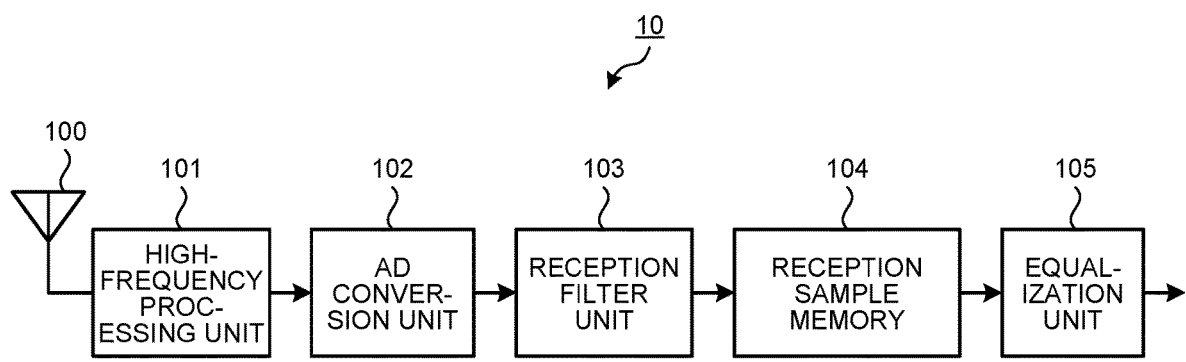
FIG. 1 is a diagram illustrating a configuration of a receiving device according to a first embodiment of the present invention.

FIG. 1 is a diagram illustrating a configuration of a receiving device according to the first embodiment of the present invention. The receiving device 10 illustrated in FIG. 1 includes a receiving antenna 100, a high-frequency processing unit 101, an analog/digital (AD) conversion unit 102, a reception filter unit 103, a reception sample memory 104, and an equalization unit 105.

The receiving antenna 100 receives a high-frequency analog signal transmitted from a transmitting device (not illustrated). The receiving antenna 100 inputs the received high-frequency analog signal to the high-frequency processing unit 101. The high-frequency processing unit 101 is a processing circuit that performs high-frequency signal processing including filter processing and down-conversion on the high-frequency analog signal input from the receiving antenna 100. The high-frequency processing unit 101 inputs the analog signal subjected to the high-frequency signal processing to the AD conversion unit 102. The AD conversion unit 102 is an AD converter, i.e., a processing circuit that converts the input analog signal into a digital signal. The AD conversion unit 102 inputs the digital signal to the reception filter unit 103.

The reception filter unit 103 is a processing circuit that samples the input digital signal using digital filter processing to obtain reception sample signals. The reception filter unit 103 samples the reception signal at sample intervals shorter than the symbol intervals. The reception filter unit 103 inputs the reception sample signals to the reception sample memory 104. The reception sample memory 104 is a memory that stores the input reception sample signals. The equalization unit 105 is a maximum likelihood sequence estimation circuit that performs maximum likelihood sequence estimation processing using the reception sample signals written in the reception sample memory 104 and outputs demodulated bits. The high-frequency processing unit 101, the AD conversion unit 102, the reception filter unit 103, and the equalization unit 105 may be realized by a single processing circuit. Alternatively, the functions of the high-frequency processing unit 101, the AD conversion unit 102, the reception filter unit 103, and the equalization unit 105 may be realized by different processing circuits.

The series of processes from the reception of a signal by the receiving antenna 100 to the storage of reception sample signals in the reception sample memory 104 can be realized by combining some well-known techniques. The series of processes described above may be performed such that the reception sample signals sampled at sample intervals shorter than the symbol intervals are stored in the reception sample memory 104. For example, the high-frequency processing unit 101 may subject the high-frequency analog reception signal received by the receiving antenna 100 to down-conversion processing and quadrature detection processing to output a baseband signal having the I-phase and a baseband signal having the Q-phase. At this time, the AD conversion unit 102 receives the I-phase baseband signal and the Q-phase baseband signal and converts each of the input I-phase baseband signal and the Q-phase baseband signal into a digital signal. The reception filter unit 103 performs waveform shaping using, for example, a root Nyquist filter, generates reception sample signals for each of the I-phase and the Q-phase, and stores them in the reception sample memory 104. Alternatively, the high-frequency processing unit 101 may convert the high-frequency analog reception signal into a signal in an intermediate frequency band and input it to the AD conversion unit 102.

Figure 2:
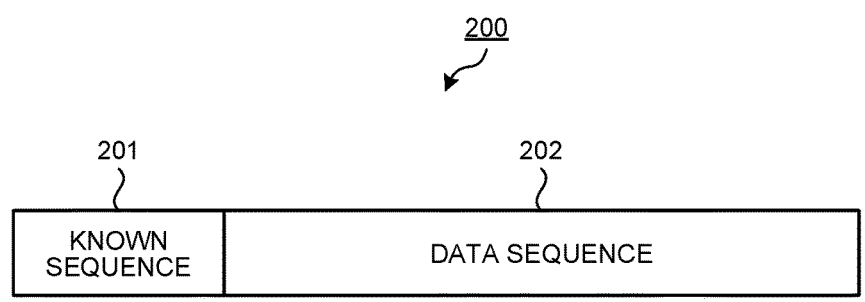
FIG. 2 is a diagram illustrating the format of a frame received by the receiving device illustrated in FIG. 1.

FIG. 2 is a diagram illustrating the format of a frame received by the receiving device illustrated in FIG. 1. This frame 200 includes a known sequence 201 and a data sequence 202. The known sequence 201 is a fixed sequence determined beforehand between a transmitting device with which the receiving device 10 communicates and the receiving device 10. In FIG. 2, the known sequence 201 is arranged at the beginning of the frame. Alternatively, the known sequence 201 may be inserted in the middle of the frame, or the known sequence 201 may be arranged at the end of the frame. The known sequence 201 is used for the process of establishing reception frame synchronization and the process of estimating the reception sample signals including a preceding wave component and a delayed wave component.

Figure 3:
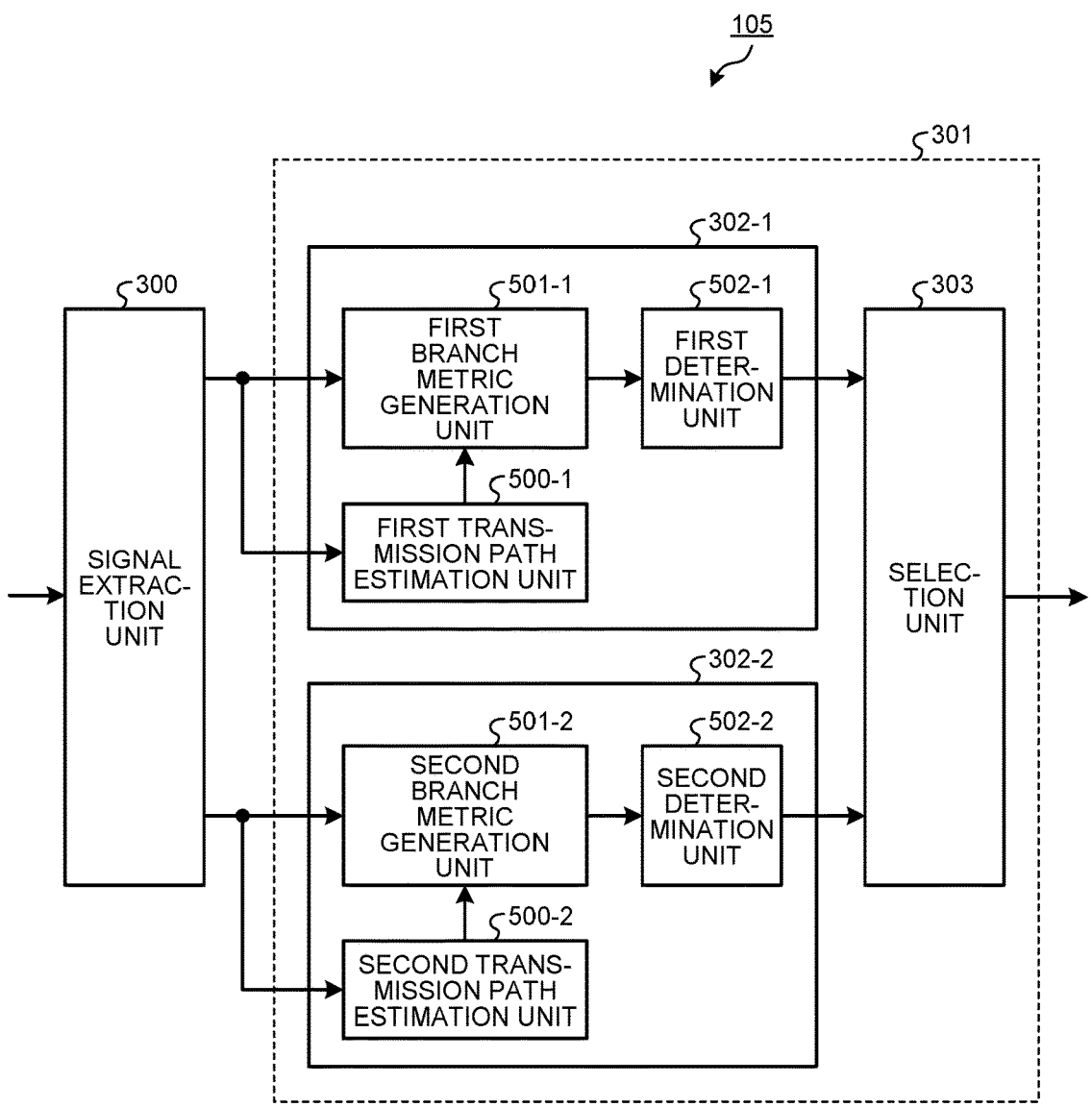
FIG. 3 is a diagram illustrating a configuration of an equalization unit illustrated in FIG. 1.

FIG. 3 is a diagram illustrating a configuration of the equalization unit illustrated in FIG. 1. The equalization unit 105 includes a signal extraction unit 300 and a maximum likelihood sequence estimation unit 301. The maximum likelihood sequence estimation unit 301 includes two separate sequence estimation units 302 and a selection unit 303. The two separate sequence estimation units 302 are referred to as a first sequence estimation unit 302-1 and a second sequence estimation unit 302-2. The first sequence estimation unit 302-1 and the second sequence estimation unit 302-2 have similar configurations. Specifically, the first sequence estimation unit 302-1 includes a first transmission path estimation unit 500-1, a first branch metric generation unit 501-1, and a first determination unit 502-1. The second sequence estimation unit 302-2 includes a second transmission path estimation unit 500-2, a second branch metric generation unit 501-2, and a second determination unit 502-2. The first sequence estimation unit 302-1 and the second sequence estimation unit 302-2 operate at different timings to estimate maximum likelihood sequences, and the selection unit 303 selects one of the two maximum likelihood sequence estimation results and generates demodulated bits.

The signal extraction unit 300 receives the reception sample signals stored in the reception sample memory 104, and performs, using the received reception sample signals, reception frame synchronization processing and signal extraction processing for extracting reception sample signals for use in maximum likelihood sequence estimation processing. The signal extraction unit 300 performs reception frame synchronization by detecting known sequences 201 from the reception sample signals received from the reception sample memory 104. The signal extraction unit 300 holds the known sequence 201 in advance, and can implement reception frame synchronization by computing the correlations with the known sequences 201 of the reception sample signals. The known sequence 201 is desirably a sequence with a good autocorrelation property such as a pseudo noise (PN) sequence.

From the reception sample signals received from the reception sample memory 104, the signal extraction unit 300 extracts first reception sample signals to be output to the first sequence estimation unit 302-1 and second reception sample signals to be output to the second sequence estimation unit 302-2. The signal extraction unit 300 estimates the reception sample signal including a preceding wave component and the reception sample signal including a delayed wave component by using the reception sample signals. In a case where there is a plurality of delayed waves, the signal extraction unit 300 estimates the reception sample signal including the most-delayed wave component. A method of estimation may include, for example, computing the correlations between the reception sample signals and a known signal. The known signal is, for example, the known sequence 201 illustrated in FIG. 2. The signal extraction unit 300 computes the correlations between the reception sample signals and the known sequence 201 to calculate correlation power. Correlation power indicates the similarity between a reception sample signal and the known sequence 201. The higher the similarity, the larger the correlation power value. The signal extraction unit 300 estimates the reception sample signal including a preceding wave component and the reception sample signal including a delayed wave component based on the correlation power values. The signal extraction unit 300 determines that the reception sample signal whose correlation power value is equal to or larger than a predetermined threshold is a signal including a preceding wave component or a delayed wave component. The signal extraction unit 300 determines a first beginning address that is the beginning address of the reception sample signals to be delivered to the first sequence estimation unit 302-1 and a second beginning address that is the beginning address of the reception sample signals to be delivered to the second sequence estimation unit 302-2. Specifically, based on the sample positions of the reception sample signals whose correlation power values are equal to or larger than the threshold and the tap length for symbol rate equalization, the signal extraction unit 300 determines the first beginning address and the second beginning address. The first beginning address and the second beginning address are indicated by sample numbers, for example.

Figure 4:
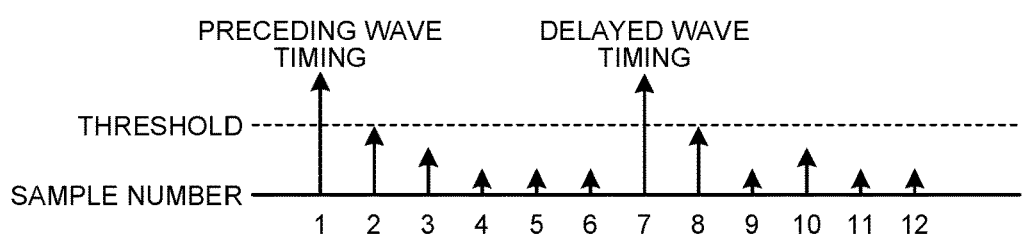
FIG. 4 is a diagram for explaining the function of a signal extraction unit illustrated in FIG. 3.

FIG. 4 is a diagram for explaining the function of the signal extraction unit illustrated in FIG. 3. The horizontal axis of FIG. 4 represents the sample numbers allocated to the reception sample signals, and the vertical axis of FIG. 4 represents the magnitude of correlation power calculated as the result of computing the correlation between each reception sample signal and the known sequence 201. The example of FIG. 4 is based on the assumption that the signal is oversampled at four times the symbol rate, and the sample interval is one-fourth of the symbol interval. In sample number 1 and sample number 7, the correlation power values are equal to or larger than the predetermined threshold. In this case, the signal extraction unit 300 determines that sample number 1 is the arrival timing of the preceding wave, and determines that sample number 7 is the arrival timing of the delayed wave. That is, the signal extraction unit 300 determines that the reception sample signal of sample number 1 is a signal including a preceding wave component, and determines that the reception sample signal of sample number 7 is a signal including a delayed wave component. In the example of FIG. 4, the delayed wave reaches the receiving device 10 with a delay of six samples from the preceding wave. As described above, the sample interval for the reception sample signals is one-fourth of the symbol interval. Therefore, the delayed wave reaches the receiving device 10 with a delay of 1.5 symbols from the preceding wave.

The signal extraction unit 300 determines the tap length for symbol rate equalization based on the estimated arrival timings of the preceding wave and the delayed wave. The tap length for symbol rate equalization is set to be equal to or longer than the estimated sample interval between the preceding wave and the delayed wave so that the received preceding wave and the delayed wave are all equalized in the maximum likelihood sequence estimation unit 301 in the subsequent stage. In the example of FIG. 4, since the sample interval between the preceding wave and the delayed wave is six samples and is 1.5 symbols, the signal extraction unit 300 can set the tap length for symbol rate equalization to three. The tap length for symbol rate equalization is used by both the first sequence estimation unit 302-1 and the second sequence estimation unit 302-2. The signal extraction unit 300 outputs the tap length for symbol rate equalization to the first sequence estimation unit 302-1 and the second sequence estimation unit 302-2.

Based on the estimated arrival timings of the preceding wave and the delayed wave and the tap length for symbol rate equalization, the signal extraction unit 300 determines the first beginning address and the second beginning address such that the reception sample signal including a preceding wave component and the reception sample signal including a delayed wave component are input to the maximum likelihood sequence estimation unit 301 in the subsequent stage. Specifically, the signal extraction unit 300 calculates the first beginning address such that the estimated preceding wave timing coincides with the preceding wave tap, i.e., the first tap of the tap length for symbol rate equalization. In the example illustrated in FIG. 4, the first beginning address is sample number 1. From the reception sample signals received from the reception sample memory 104, the signal extraction unit 300 extracts reception sample signals at symbol intervals starting from the reception sample signal corresponding to the first beginning address, and outputs the extracted reception sample signals as the first reception sample signals. When the oversampling rate is four, the signal extraction unit 300 extracts reception sample signals every four samples. As a result, sample numbers 1, 5, and 9 are assigned to the first, second, and third taps of the tap length for symbol rate equalization, respectively. The signal extraction unit 300 calculates the second beginning address such that the estimated most-delayed wave timing coincides with the most-delayed wave tap, i.e., the third tap of the tap length for symbol rate equalization. In the example illustrated in FIG. 4, the second beginning address is determined such that the timing of sample number 7 coincides with the third tap. The second beginning address is the address of the reception sample signal assigned to the first tap, and is sample number −1 (not illustrated). From the reception sample signals received from the reception sample memory 104, the signal extraction unit 300 extracts reception sample signals at symbol intervals starting from the reception sample signal corresponding to the second beginning address, and outputs the extracted reception sample signals as the second reception sample signals. As a result, sample numbers −1, 3, and 7 are assigned to the first, second, and third taps of the tap length for symbol rate equalization, respectively.

The first sequence estimation unit 302-1 and the second sequence estimation unit 302-2 have similar configurations. Although different reception sample signals are input, the first sequence estimation unit 302-1 and the second sequence estimation unit 302-2 perform similar processes on the input reception sample signals. Hereinafter, therefore, the function of the first sequence estimation unit 302-1 will be described.

The first sequence estimation unit 302-1 performs maximum likelihood sequence estimation that operates at a symbol rate based on the Viterbi algorithm. For example, the first sequence estimation unit 302-1 uses a method such as Maximum Likelihood Sequence Estimation (MLSE) or Decision Feedback Sequence Estimation (DFSE). The first reception sample signals extracted by the signal extraction unit 300 from the reception sample signals stored in the reception sample memory 104 are input to the first sequence estimation unit 302-1. As the result of processing, the first sequence estimation unit 302-1 outputs, to the selection unit 303, demodulated bits and the path metric corresponding to the demodulated bits.

The first transmission path estimation unit 500-1 receives, at symbol intervals, the first reception sample signals output by the signal extraction unit 300. The first transmission path estimation unit 500-1 executes, at symbol intervals, the process of estimating a transmission path impulse response using the portion, corresponding to the known sequence 201, of the received first reception sample signal. The first transmission path estimation unit 500-1 can use any known technique as a method for transmission path estimation processing. For example, a method for deriving a transmission impulse response using the method of least squares is disclosed in the document "Jun Horikoshi supervised, Waveform Equalization Technique for Digital Mobile Communication, Triceps". With this method, a transmission impulse response is derived such that the error power between the replica generated from the estimated transmission path impulse response and a known signal and the received known signal is minimized. The first transmission path estimation unit 500-1 may calculate transmission path impulse responses up to the tap length for symbol rate equalization received from the signal extraction unit 300. Alternatively, the first transmission path estimation unit 500-1 may calculate transmission path impulse responses up to a fixed value "L", which is the maximum transmission path impulse response expected by the receiving device 10. In a case where the tap length for symbol rate equalization received from the signal extraction unit 300 is larger than L, the first transmission path estimation unit 500-1 may calculate transmission path impulse responses up to L. The first transmission path estimation unit 500-1 outputs the calculated transmission path impulse responses to the first branch metric generation unit 501-1.

The first branch metric generation unit 501-1 receives, at symbol intervals, the first reception sample signals output by the signal extraction unit 300, and receives the transmission path impulse responses output by the first transmission path estimation unit 500-1. The first branch metric generation unit 501-1 generates branch metrics based on the received first reception sample signals and transmission path impulse responses, and outputs the branch metrics as first branch metrics. Specifically, a first branch metric is the square of the difference between the replica reception signal generated from modulation symbol candidates and the reception sample signal.

The first branch metric generation unit 501-1 generates a replica reception signal based on the transmission path impulse responses corresponding to the tap length for symbol rate equalization output by the signal extraction unit 300. For example, in a case where the tap length for symbol rate equalization is three, assuming that the transmission path impulse responses for the three symbols are h[0], h[1], and h[2], and the modulation symbol candidate for the n-th symbol is s[n], the replica reception signal r'[n] is represented by Formula (1) below.

$$r'[n]=h[0]s[n]+h[1]s[n-1]+h[2]s[n-2] \quad (1)$$

Assuming that the reception sample signal for the n-th symbol is r[n], the branch metric is represented by Formula (2) below.

$$|r[n]-r'[n]|^2 \quad (2)$$

The first determination unit 502-1 receives the first branch metrics output by the first branch metric generation unit 501-1, and determines, using the Viterbi algorithm, the modulation symbol candidate with the smallest error with respect to the series of reception sample signals input at symbol intervals. More specifically, in a case where the modulation multi-level number is M and the transmission path impulse response length is L, the first determination unit 502-1 determines, based on a trellis diagram having $M^L$ states, the sequence that minimizes the square error between the reception sample signals and the replica reception signals along the trellis diagram. In the case of quadrature phase shift keying (QPSK) modulation, the modulation multi-level number M is four. Assuming that P is an integer equal to or less than the sequence length to be subjected to maximum likelihood sequence estimation, the first determination unit 502-1 holds the survival path information and path metrics corresponding to the past P symbols for each state. The first branch metric generation unit 501-1 generates a branch metric corresponding to the path from a state of the (n−1)-th symbol to a state of the n-th symbol on the trellis diagram. The first determination unit 502-1 adds the first branch metric and the path metric associated with the corresponding state. After finishing the addition of all the branch metrics and the path metrics associated with the transition from the (n−1)-th symbol to the n-th symbol, the first determination unit 502-1 selects the path with a small resulting path metric from among the paths for each state, and keeps it as a survival path. The first determination unit 502-1 holds, as survival path information, the modulation symbol candidates for the n-th symbol corresponding to the survival paths, selects the symbol corresponding to the smallest path metric from among the symbols held as the survival path information, and outputs it as a determination symbol. The first determination unit 502-1 outputs the smallest path metric as well as the determination symbol. With this configuration, the (n−P)-th determination symbol is fixed by the path metric update for the n-th symbol. The first determination unit 502-1 sequentially executes the above processing until the sequence length to be subjected to maximum likelihood sequence estimation is all processed.

The above description regarding the first sequence estimation unit 302-1 can be read as a description of the second sequence estimation unit 302-2. In the above description, the first sequence estimation unit 302-1, the first transmission path estimation unit 500-1, the first branch metric generation unit 501-1, the first determination unit 502-1, and the first reception sample signals can be replaced with the second sequence estimation unit 302-2, the second transmission path estimation unit 500-2, the second branch metric generation unit 501-2, the second determination unit 502-2, and the second reception sample signals, respectively. In this case, the first branch metrics output by the first branch metric generation unit 501-1 are replaced with the second branch metrics, and the second determination unit 502-2 determines the maximum likelihood sequence based on the second branch metrics. As a result, the first sequence estimation unit 302-1 and the second sequence estimation unit 302-2 each output determination symbols and the path metric corresponding to the determination symbols. Hereinafter, the path metric output by the first sequence estimation unit 302-1 is referred to as a first path metric, and the path metric output by the second sequence estimation unit 302-2 is referred to as a second path metric.

The selection unit 303 receives the first path metric output by the first sequence estimation unit 302-1, the determination symbols corresponding to the first path metric, the second path metric output by the second sequence estimation unit 302-2, and the determination symbols corresponding to the second path metric. The selection unit 303 compares the first path metric and the second path metric and selects the determination symbols corresponding to the smaller path metric. The selection unit 303 converts the reception signal into bits based on the selected determination symbols and outputs the bits as demodulated bits.

As described above, according to the first embodiment, the signal extraction unit 300 estimates the reception sample signal including a preceding wave component and the reception sample signal including a delayed wave component from the reception sample signals sampled from a reception signal at sample intervals shorter than the symbol intervals. Based on the estimation result, the first reception sample signals and the second reception sample signals are extracted for input to the maximum likelihood sequence estimation unit 301. Then, the maximum likelihood sequence estimation unit 301 estimates the maximum likelihood sequence using the extracted first reception sample signals and the second reception sample signals. As a result, it is possible to avoid using reception sample signals oversampled at timings which are not necessarily effective for maximum likelihood sequence estimation processing, so that good communication quality with reduced noise can be realized. For example, in the example of FIG. 4, if the reception sample signals of sample numbers 2, 6, and 10 are extracted with respect to a tap length of three for symbol rate equalization, effective delayed wave components are not included in these reception sample signals. According to the present embodiment, it is possible to avoid performing maximum likelihood sequence estimation processing using such reception sample signals. Even when the sample interval is shortened to generate more reception sample signals, maximum likelihood sequence estimation processing can be performed using two strings of reception sample signals extracted therefrom. Therefore, processes such as transmission path estimation and branch metric generation can be performed with two separate circuits, and an increase in circuit scale can be prevented.

Specifically, the maximum likelihood sequence estimation unit 301 includes the first sequence estimation unit 302-1 that performs maximum likelihood sequence estimation processing using the first reception sample signals, the second sequence estimation unit 302-2 that performs maximum likelihood sequence estimation processing using the second reception sample signals, and the selection unit 303 that selects one of the result of processing of the first sequence estimation unit 302-1 and the result of processing of the second sequence estimation unit 302-2. With this configuration, it is possible to select a more likely processing result from among the results of the maximum likelihood sequence estimation processes performed based on different reception sample signals. Therefore, the communication quality can be improved.

In the above-described first embodiment, the first sequence estimation unit 302-1 and the second sequence estimation unit 302-2 perform general maximum likelihood sequence estimation. However, the present invention is not limited to this example. Any method can be used for maximum likelihood sequence estimation as long as it uses an algorithm for trellis-based sequence estimation. For example, a reduced-complexity algorithm that is based on the well-known M-algorithm or the like may be used.

In the above-described first embodiment, the signal extraction unit 300 determines the first beginning address and the second beginning address based on the addresses indicating the sample positions of the reception sample signals whose correlation power is equal to or larger than the predetermined threshold. The reception sample signals extracted at symbol intervals starting from the reception sample signal corresponding to the first beginning address are set as the first reception sample signals, and the reception sample signals extracted at symbol intervals starting from the reception sample signal corresponding to the second beginning address are set as the second reception sample signals. However, in this case, the timings of extracting the first reception sample signals can overlap with the timings of extracting the second reception sample signals. In this case, the first sequence estimation unit 302-1 and the second sequence estimation unit 302-2 produce the same processing result. Therefore, if the timings of extracting the first reception sample signals overlap with the timings of extracting the second reception sample signals, that is, if the interval between the first beginning address and the second beginning address is an integer multiple of the symbol interval, the signal extraction unit 300 may add a fixed sample offset to the first beginning address or the second beginning address. The fixed sample offset is desirably, for example, 0.5 symbols or less. As a result, even when an estimation error occurs between the reception sample signal including a preceding wave component and the reception sample signal including a delayed wave component, the first reception sample signals and the second reception sample signals can be extracted at different timings.

Second Embodiment

Figure 5:
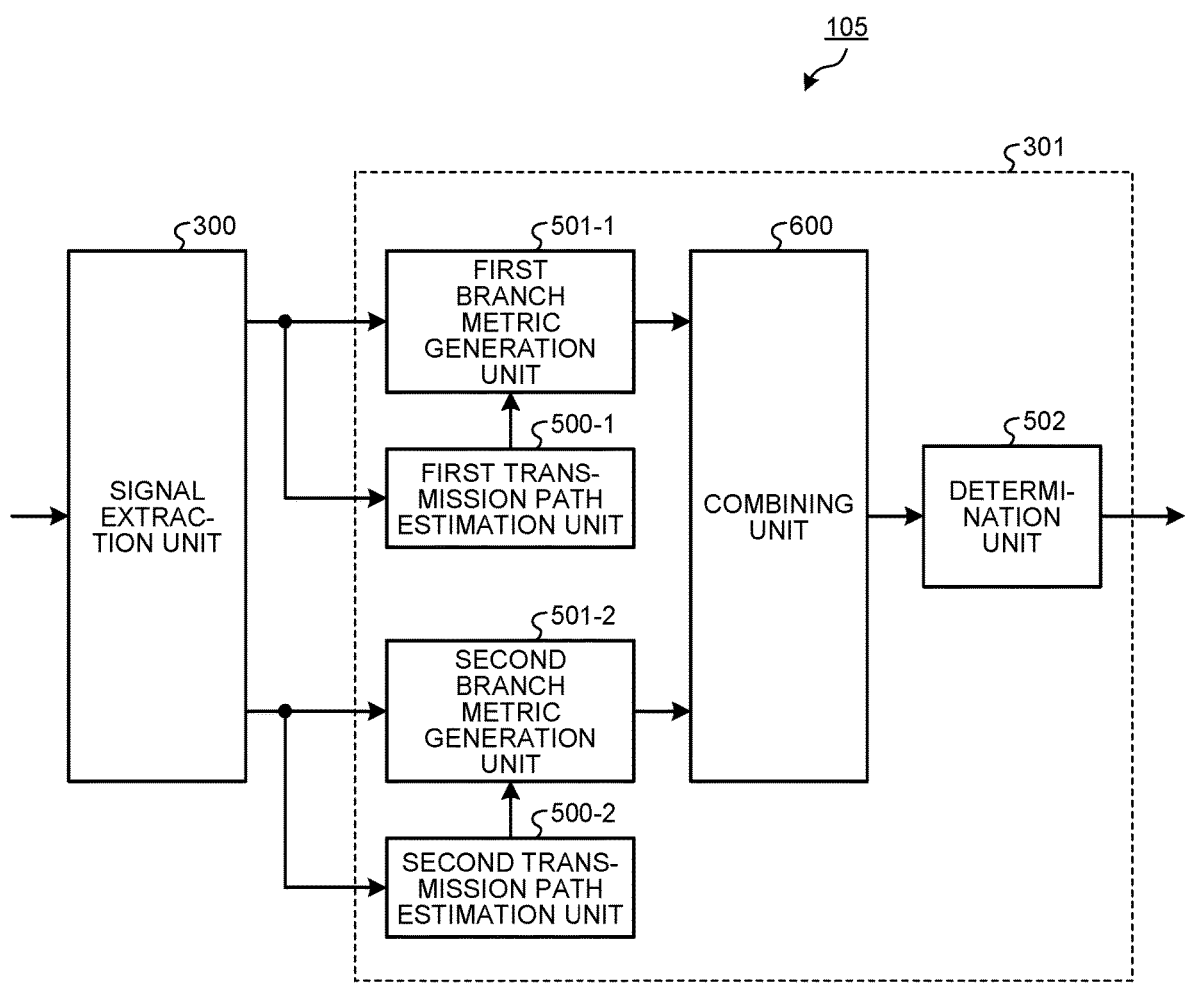
FIG. 5 is a diagram illustrating a configuration of an equalization unit of a receiving device according to a second embodiment of the present invention.

FIG. 5 is a diagram illustrating a configuration of an equalization unit of a receiving device according to the second embodiment of the present invention. Since the configuration of the receiving device according to the second embodiment is similar to the configuration of the receiving device 10 according to the first embodiment, the description thereof is omitted. The equalization unit 105 illustrated in FIG. 5 includes the signal extraction unit 300 and the maximum likelihood sequence estimation unit 301. The equalization unit 105 illustrated in FIG. 5 differs from the equalization unit 105 illustrated in FIG. 3 in the configuration of the maximum likelihood sequence estimation unit 301. Hereinafter, differences from the equalization unit 105 illustrated in FIG. 3 will be mainly described.

The maximum likelihood sequence estimation unit 301 illustrated in FIG. 5 includes the first transmission path estimation unit 500-1, the second transmission path estimation unit 500-2, the first branch metric generation unit 501-1, the second branch metric generation unit 501-2, a combining unit 600, and a determination unit 502. Since the first transmission path estimation unit 500-1, the second transmission path estimation unit 500-2, the first branch metric generation unit 501-1, and the second branch metric generation unit 501-2 are similar to those of the first embodiment, the description thereof is omitted.

The combining unit 600 generates combined branch metrics by combining the first branch metrics output by the first branch metric generation unit 501-1 and the second branch metrics output by the second branch metric generation unit 501-2. The combining unit 600 outputs the generated combined branch metrics to the determination unit 502.

The determination unit 502 has the same function as the first determination unit 502-1 described in the first embodiment, except that it uses combined branch metrics instead of the first branch metrics.

As described above, the equalization unit 105 according to the second embodiment has the two sets of transmission path estimation units 500 and branch metric generation units 501, and the branch metrics output by the two sets of units are combined by the combining unit 600 into combined branch metrics, which are output to the determination unit 502. In this case, since only one determination unit 502 is needed, the equalization unit 105 according to the second embodiment can have an even smaller circuit scale than the equalization unit 105 described in the first embodiment.

Third Embodiment

Figure 6:
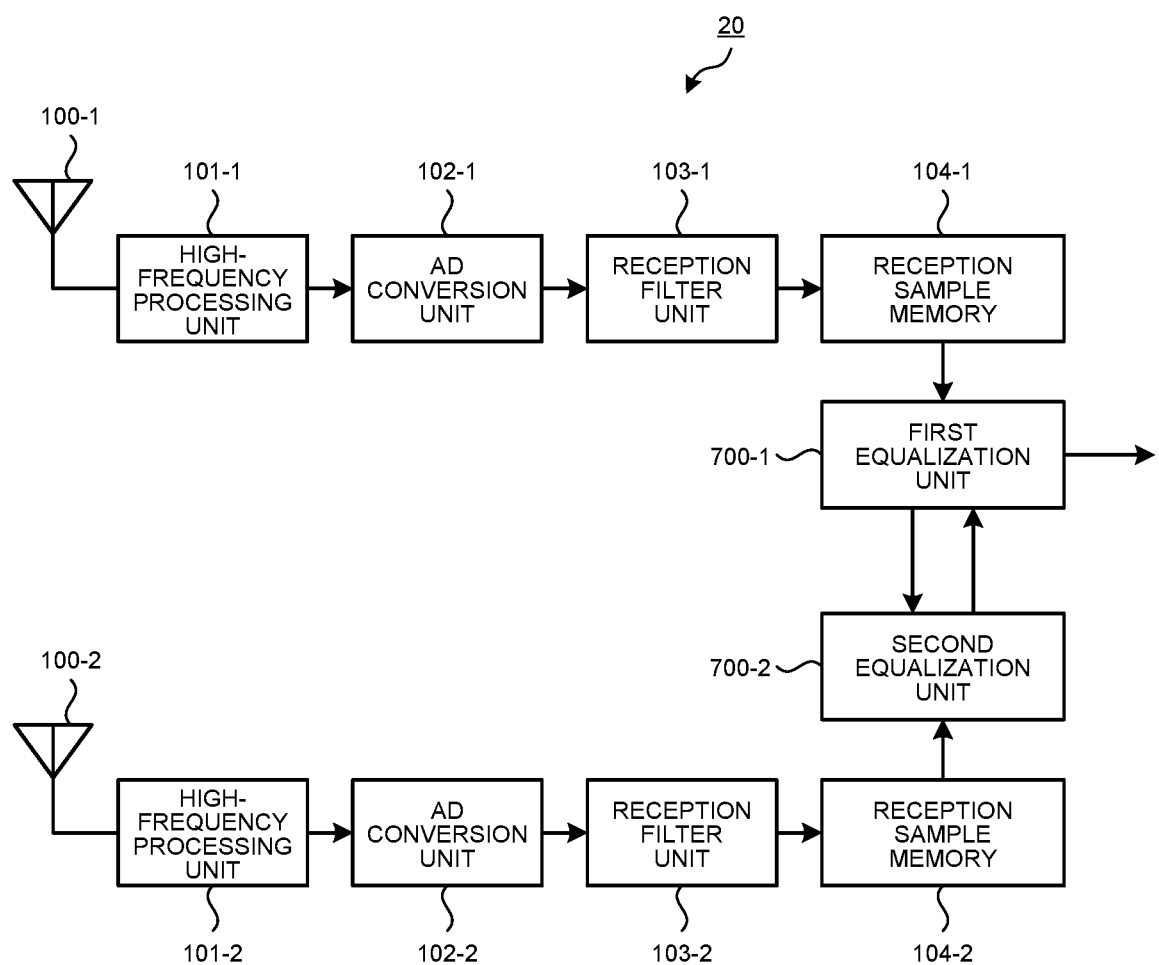
FIG. 6 is a diagram illustrating a configuration of a receiving device according to a third embodiment of the present invention.

FIG. 6 is a diagram illustrating a configuration of a receiving device according to the third embodiment of the present invention. The receiving device 20 illustrated in FIG. 6 has a plurality of (specifically, two) separate receiving antennas, and has a reception diversity configuration. Specifically, the receiving device 20 includes two receiving antennas 100-1 and 100-2 and a first equalization unit 700-1 and a second equalization unit 700-2 respectively corresponding to the receiving antenna 100-1 and the receiving antenna 100-2. Between the receiving antenna 100-1 and the first equalization unit 700-1, a high-frequency processing unit 101-1, an AD conversion unit 102-1, a reception filter unit 103-1, and a reception sample memory 104-1 are provided. Between the receiving antenna 100-2 and the second equalization unit 700-2, a high-frequency processing unit 101-2, an AD conversion unit 102-2, a reception filter unit 103-2, and a reception sample memory 104-2 are provided. The configurations of the high-frequency processing unit 101-1, the AD conversion unit 102-1, the reception filter unit 103-1, and the reception sample memory 104-1 may be similar to the configurations of the high-frequency processing unit 101-2, the AD conversion unit 102-2, the reception filter unit 103-2, and the reception sample memory 104-2. These units can be the high-frequency processing unit 101, the AD conversion unit 102, the reception filter unit 103, and the reception sample memory 104 described in the first embodiment.

Figure 7:
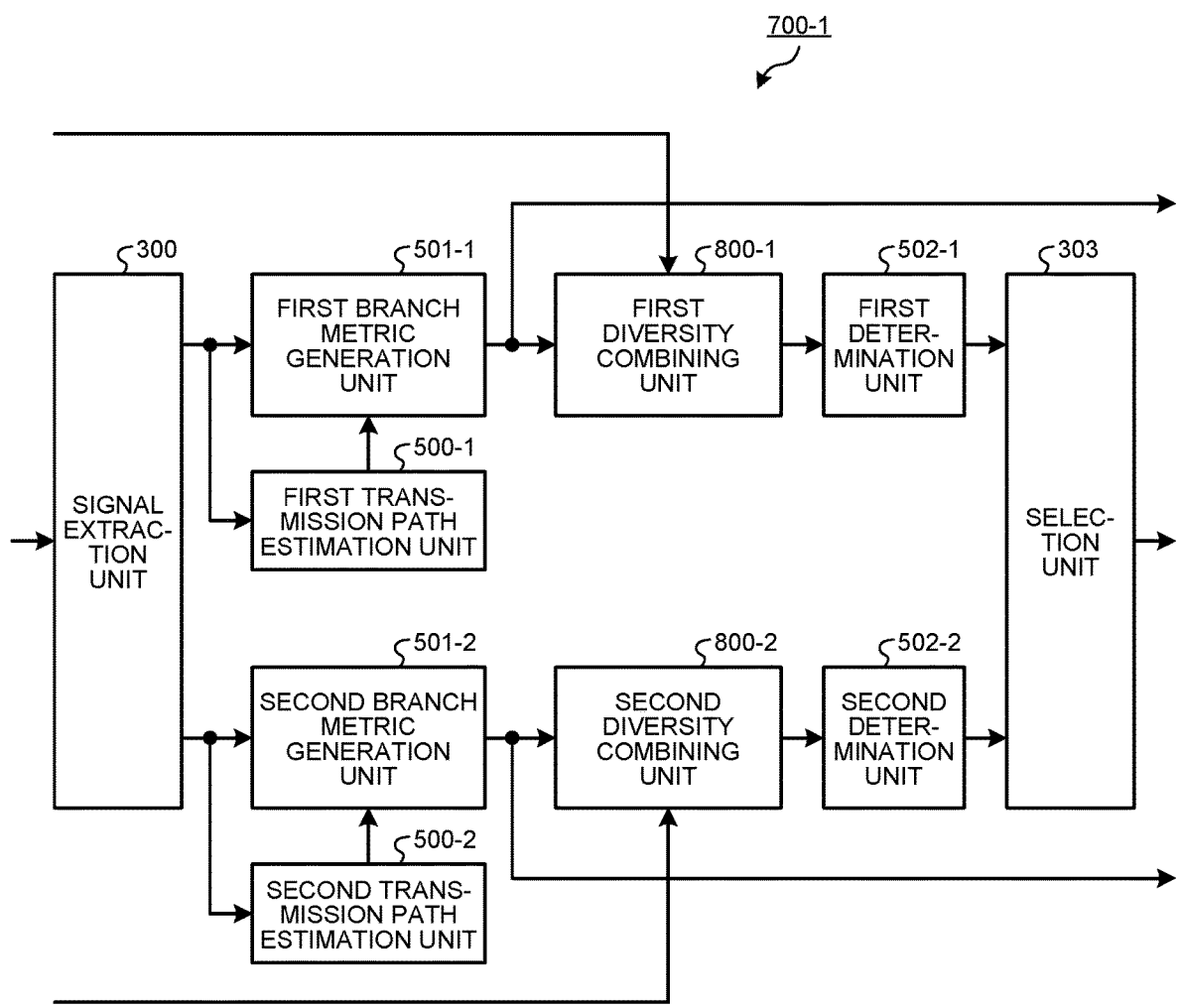
FIG. 7 is a diagram illustrating a configuration of a first equalization unit illustrated in FIG. 6.

FIG. 7 is a diagram illustrating a configuration of the first equalization unit illustrated in FIG. 6. The first equalization unit 700-1 includes the signal extraction unit 300, the first transmission path estimation unit 500-1, the first branch metric generation unit 501-1, a first diversity combining unit 800-1, and the first determination unit 502-1. The first equalization unit 700-1 further includes the second transmission path estimation unit 500-2, the second branch metric generation unit 501-2, a second diversity combining unit 800-2, the second determination unit 502-2, and the selection unit 303. Components similar to the components in the first embodiment are denoted by the same reference signs, and a detailed description thereof is omitted. Hereinafter, differences from the first embodiment will be mainly described.

The first branch metrics output by the first branch metric generation unit 501-1 are input to the first diversity combining unit 800-1 of the first equalization unit 700-1 and the first diversity combining unit 800-1 of the second equalization unit 700-2. The second branch metrics output by the second branch metric generation unit 501-2 are input to the second diversity combining unit 800-2 of the first equalization unit 700-1 and the second diversity combining unit 800-2 of the second equalization unit 700-2.

To the first diversity combining unit 800-1, the first branch metrics output by the first branch metric generation unit 501-1 of the first equalization unit 700-1 and the first branch metrics output by the first branch metric generation unit 501-1 of the second equalization unit 700-2 are input. The first diversity combining unit 800-1 adds the first branch metrics output by the first branch metric generation unit 501-1 of the first equalization unit 700-1 and the first branch metrics output by the first branch metric generation unit 501-1 of the second equalization unit 700-2, and outputs the result to the first determination unit 502-1. Here, the first diversity combining unit 800-1 adds together the first branch metrics corresponding to the same symbol time and the same state transition on the trellis diagram.

To the second diversity combining unit 800-2, the second branch metrics output by the second branch metric generation unit 501-2 of the first equalization unit 700-1 and the second branch metrics output by the second branch metric generation unit 501-2 of the second equalization unit 700-2 are input. The second diversity combining unit 800-2 adds the second branch metrics output by the second branch metric generation unit 501-2 of the first equalization unit 700-1 and the second branch metrics output by the second branch metric generation unit 501-2 of the second equalization unit 700-2, and outputs the result to the second determination unit 502-2. Here, the second diversity combining unit 800-2 adds together the second branch metrics corresponding to the same symbol time and the same state transition on the trellis diagram.

The first determination unit 502-1, the second determination unit 502-2, and the selection unit 303 execute the same processing as in the first embodiment, and demodulated bits are output by the selection unit 303. The second equalization unit 700-2 has a configuration similar to the configuration of the first equalization unit 700-1. The only difference is that the output of the selection unit 303 is not used in the subsequent stage and thus need not be sent to the outside.

As described above, according to the third embodiment of the present invention, even in the receiving device 20 having a plurality of separate receiving antennas, the first reception sample signals and the second reception sample signals extracted by the signal extraction unit 300 are used for maximum likelihood sequence estimation processing. At this time, the branch metrics generated during the maximum likelihood sequence estimation processing are combined among the plurality of separate receiving antennas. Therefore, it is possible to improve the communication quality while preventing an increase in circuit scale.

Fourth Embodiment

Figure 8:
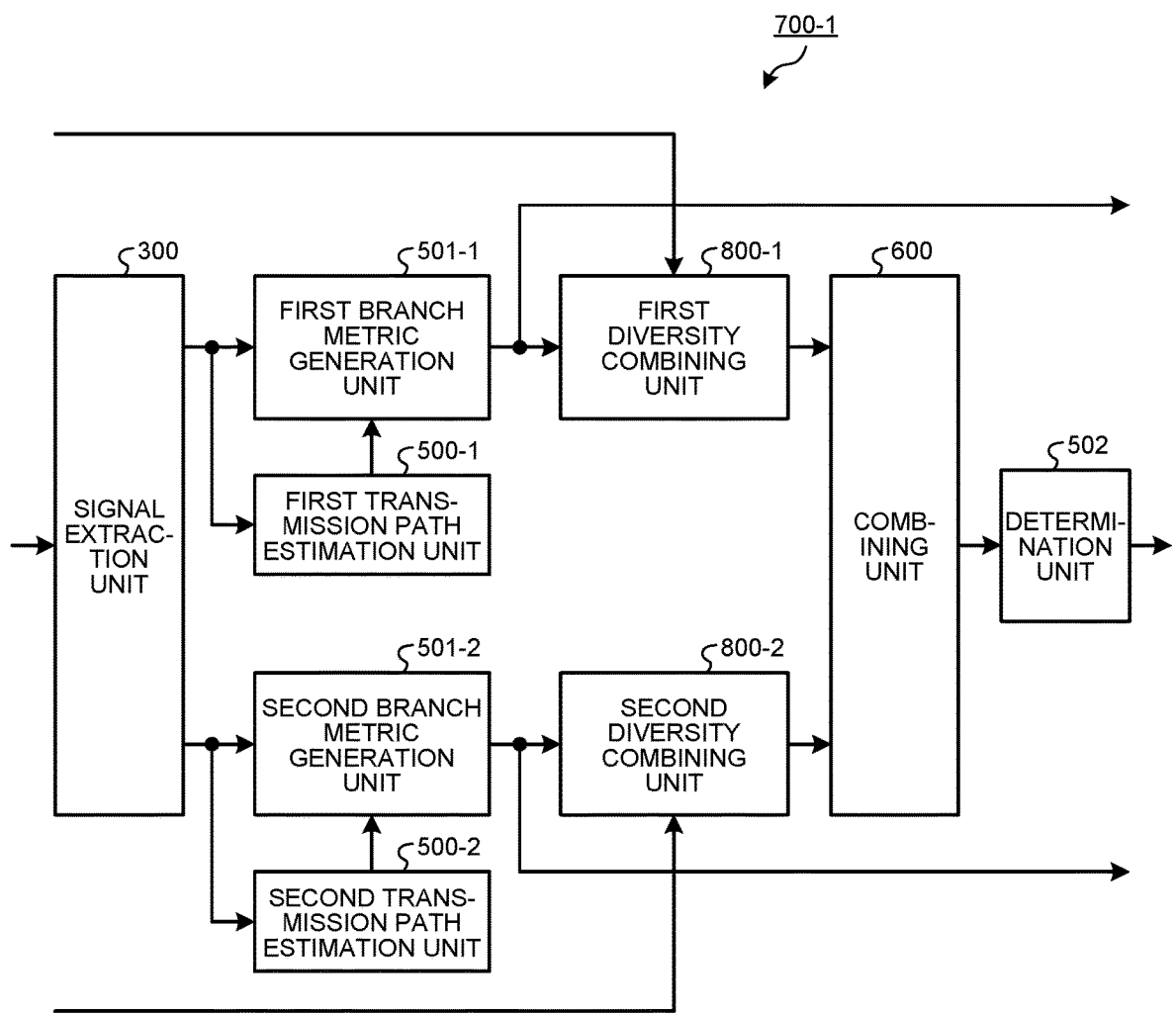
FIG. 8 is a diagram illustrating a configuration of a first equalization unit of a receiving device according to a fourth embodiment of the present invention.

FIG. 8 is a diagram illustrating a configuration of a first equalization unit of a receiving device according to the fourth embodiment of the present invention. Since the configuration of the receiving device according to the fourth embodiment is similar to the configuration of the receiving device 20 illustrated in FIG. 6, the description thereof is omitted. The first equalization unit 700-1 according to the fourth embodiment includes the signal extraction unit 300, the first transmission path estimation unit 500-1, the first branch metric generation unit 501-1, and the first diversity combining unit 800-1. The first equalization unit 700-1 further includes the second transmission path estimation unit 500-2, the second branch metric generation unit 501-2, the second diversity combining unit 800-2, the combining unit 600, and the determination unit 502. In other words, the first equalization unit 700-1 according to the fourth embodiment includes the combining unit 600 and the determination unit 502 instead of the first determination unit 502-1, the second determination unit 502-2, and the selection unit 303 of the first equalization unit 700-1 according to the third embodiment.

The first diversity combining unit 800-1 outputs the combined first branch metrics to the combining unit 600, and the second diversity combining unit 800-2 outputs the combined second branch metrics to the combining unit 600. The combining unit 600 generates combined branch metrics by combining the combined first branch metrics and the combined second branch metrics. The combining unit 600 outputs the generated combined branch metrics to the determination unit 502. The determination unit 502 receives the combined branch metrics output by the combining unit 600, performs maximum likelihood sequence determination processing based on the combined branch metrics, and outputs the demodulated bits generated as the result of the maximum likelihood sequence determination processing.

According to the fourth embodiment, the communication quality can be improved in the same manner as in the third embodiment. Since the determination units of the third embodiment can be integrated into one determination unit, the equalization units according to the fourth embodiment can have an even smaller circuit scale than the equalization units according to the third embodiment.

The configuration described in the above-mentioned embodiments indicates an example of the contents of the present invention. The configuration can be combined with another well-known technique, and a part of the configuration can be omitted or changed in a range not departing from the gist of the present invention.

REFERENCE SIGNS LIST 10, 20 receiving device; 100, 100-1, 100-2 receiving antenna; 101, 101-1, 101-2 high-frequency processing unit; 102, 102-1, 102-2 AD conversion unit; 103, 103-1, 103-2 reception filter unit; 104, 104-1, 104-2 reception sample memory; 105 equalization unit; 200 frame; 201 known sequence; 202 data sequence; 300 signal extraction unit; 301 maximum likelihood sequence estimation unit; 302 sequence estimation unit; 302-1 first sequence estimation unit; 302-2 second sequence estimation unit; 303 selection unit; 500 transmission path estimation unit; 500-1 first transmission path estimation unit; 501 branch metric generation unit; 501-1 first branch metric generation unit; 502 determination unit; 502-1 first determination unit; 502-2 second determination unit; 600 combining unit; 700 equalization unit; 700-1 first equalization unit; 700-2 second equalization unit; 800-1 first diversity combining unit; 800-2 second diversity combining unit.

The invention claimed is:

1. A maximum likelihood sequence estimation circuit comprising:
a signal extractor to estimate a reception sample signal including a preceding wave component and a reception sample signal including a delayed wave component from a plurality of reception sample signals sampled from a reception signal at sample intervals shorter than symbol intervals, and to extract, based on an estimation result, both first reception sample signals including the preceding wave component and second reception sample signals including the delayed wave component from the plurality of reception sample signals at the symbol intervals; and
a maximum likelihood sequence estimator to estimate a maximum likelihood sequence using the first reception sample signals extracted and the second reception sample signals extracted, wherein
the signal extractor determines a number of taps for the symbol intervals such that the number of taps is equal to or larger than a sample interval between an arrival timing of the preceding wave estimated and an arrival timing of the delayed wave estimated, and
the maximum likelihood sequence estimator estimates the maximum likelihood sequence based on the number of taps.

2. The maximum likelihood sequence estimation circuit according to claim 1, wherein
the signal extractor calculates correlation power by computing correlations between the reception sample signals and a known signal, and estimates the reception sample signal including the preceding wave component and the reception sample signal including the delayed wave component based on the correlation power calculated.

3. The maximum likelihood sequence estimation circuit according to claim 2, wherein
the signal extractor determines a first beginning address and a second beginning address based on addresses of the reception sample signals whose correlation power is equal to or larger than a predetermined threshold, sets, as the first reception sample signals, the reception sample signals extracted at the symbol intervals starting from the reception sample signal corresponding to the first beginning address, and sets, as the second reception sample signals, the reception sample signals extracted at the symbol intervals starting from the reception sample signal corresponding to the second beginning address, from the reception sample signals.

4. The maximum likelihood sequence estimation circuit according to claim 3, wherein
if timings of extracting the first reception sample signals overlap with timings of extracting the second reception sample signals, the signal extractor adds a fixed sample offset to the first beginning address or the second beginning address.

5. The maximum likelihood sequence estimation circuit according to claim 1, wherein
the maximum likelihood sequence estimator includes:
a first sequence estimator to perform maximum likelihood sequence estimation processing using the first reception sample signals;
a second sequence estimator to perform maximum likelihood sequence estimation processing using the second reception sample signals; and
a selector to select one of a result of processing of the first sequence estimator and a result of processing of the second sequence estimator.

6. The maximum likelihood sequence estimation circuit according to claim 1, wherein
the maximum likelihood sequence estimator includes:
a first branch metric generation circuitry to calculate branch metrics using the first reception sample signals and output the branch metrics as first branch metrics;
a second branch metric generation circuitry to calculate branch metrics using the second reception sample signals and output the branch metrics as second branch metrics;
a combining unit combiner to generate combined branch metrics by combining the first branch metrics and the second branch metrics; and
a determination circuitry to determine a maximum likelihood sequence using the combined branch metrics.

7. A receiving device comprising the maximum likelihood sequence estimation circuit according to claim 1.

8. The receiving device according to claim 7, comprising:
a plurality of receiving antennas; and
a plurality of the maximum likelihood sequence estimation circuits, each corresponding to one of the plurality of receiving antennas, wherein
each of the maximum likelihood sequence estimation circuits further includes:
a first branch metric generation circuitry to calculate branch metrics using the first reception sample signals and output the branch metrics as first branch metrics;
a second branch metric generation circuitry to calculate branch metrics using the second reception sample signals and output the branch metrics as second branch metrics;
a first diversity combiner to combine the first branch metrics output by the first branch metric generation circuitry of another maximum likelihood sequence estimation circuit with the first branch metrics output by the first branch metric generation circuitry that belongs to the same maximum likelihood sequence estimation circuit; and
a second diversity combiner to combine the second branch metrics output by the second branch metric generation circuitry of another maximum likelihood sequence estimation circuit with the second branch metrics output by the second branch metric generation circuitry that belongs to the same maximum likelihood sequence estimation circuit, and
estimates a maximum likelihood sequence using the first branch metrics combined and the second branch metrics combined.

9. A maximum likelihood sequence estimation method for a maximum likelihood sequence estimation circuit, the method comprising:
estimating a first reception sample signal that is a reception sample signal including a preceding wave component and a second reception sample signal that is a reception sample signal including a delayed wave component from a plurality of reception sample signals sampled from a reception signal at sample intervals shorter than symbol intervals;
determining a number of taps for the symbol intervals such that the number of taps is equal to or larger than a sample interval between an arrival timing of a preceding wave estimated and an arrival timing of a delayed wave estimated;
extracting both the first reception sample signals and the second reception sample signals from the plurality of reception sample signals at the symbol intervals; and
estimating a maximum likelihood sequence using the first reception sample signals extracted and the second reception sample signals extracted based on the number of taps.

10. A maximum likelihood sequence estimation circuit comprising:
a signal extractor to estimate a reception sample signal including a preceding wave component and a reception sample signal including a delayed wave component from a plurality of reception sample signals sampled from a reception signal at sample intervals shorter than symbol intervals, and to extract, based on an estimation result, both first reception sample signals and second reception sample signals from the plurality of reception sample signals at the symbol intervals; and
a maximum likelihood sequence estimator to estimate a maximum likelihood sequence using the first reception sample signals extracted and the second reception sample signals extracted, wherein
if timings of extracting the first reception sample signals overlap with timings of extracting the second reception sample signals, the signal extractor adds a fixed sample offset to a first beginning address that is a beginning address of the first reception sample signals or a second beginning address that is a beginning address of the second reception sample signals.

* * * * *